US010192616B2

(12) United States Patent
O'Toole et al.

(10) Patent No.: US 10,192,616 B2
(45) Date of Patent: Jan. 29, 2019

(54) OVONIC THRESHOLD SWITCH (OTS) DRIVER/SELECTOR USES UNSELECT BIAS TO PRE-CHARGE MEMORY CHIP CIRCUIT AND REDUCES UNACCEPTABLE FALSE SELECTS

(71) Applicant: HGST Netherlands B.V., Amsterdam (NL)

(72) Inventors: James Edwin O'Toole, Boise, ID (US); Ward Parkinson, Boise, ID (US); Daniel Robert Shepard, North Hampton, NH (US); Thomas Michael Trent, Tucson, AZ (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/194,675

(22) Filed: Jun. 28, 2016

(65) Prior Publication Data
US 2017/0372779 A1 Dec. 28, 2017

(51) Int. Cl.
*G11C 13/00* (2006.01)
*H01L 45/00* (2006.01)
*H01L 27/24* (2006.01)

(52) U.S. Cl.
CPC ...... *G11C 13/0023* (2013.01); *G11C 13/0004* (2013.01); *H01L 27/2409* (2013.01);
(Continued)

(58) Field of Classification Search
CPC ................................................. G11C 13/0023
See application file for complete search history.

(56) References Cited

U.S. PATENT DOCUMENTS 6,940,771 B2 9/2005 Kant et al.
7,082,061 B2 7/2006 Chou et al.
(Continued)

OTHER PUBLICATIONS

Ovshinsky ("New Transformative Possibilities for Ovonic Devices", European\Phase Change and Ovonics Symposium 2010, Sep. 6, 2010, Milan, Italy). Retrieved Mar. 2, 2018 from https://docs.wixstatic.com/ugd/3d44dd_aa6fc9d38a844dceb9e842e225b82445.pdf or, https://www.epcos.org/e-pcos-2010-1.*
(Continued)

*Primary Examiner* — Anthan Tran
*Assistant Examiner* — Mushfique Siddique
(74) *Attorney, Agent, or Firm* — Patterson & Sheridan, LLP; Steven Versteeg (57) ABSTRACT

The present disclosure generally relates to non-volatile memory arrays and memory devices in which a leakage current through an OTS is utilized to pre-charge a circuit of a memory chip. By running an additional wire on each side of a tile which is orthogonal to, above, or below the X and Y select wires, a high value resistance material, such as an OTS, may be deposited at the intersection. The OTS allows the word line or bit line to be selected without pulling excessive leakage to the select wire from the bias voltage, such as V/2. A thickness of the OTS is adjusted such that the $V_t$ of the OTS is greater than V/2, with margin, and the OTS does not turn on when the OTS is selected. A resistance is created between the V/2 wire and the word line select wire or the bit line select wire.

22 Claims, 5 Drawing Sheets

(52) U.S. Cl.
CPC ...... *H01L 27/2427* (2013.01); *H01L 27/2463* (2013.01); *H01L 45/04* (2013.01); *H01L 45/06* (2013.01); *H01L 45/1233* (2013.01)

(56) References Cited

U.S. PATENT DOCUMENTS

| | | | |
|---|---|---|---|
| 7,466,584 B1* | 12/2008 | Parkinson | G11C 8/10 365/148 |
| 7,539,059 B2 | 5/2009 | Lee et al. | |
| 7,613,053 B2 | 11/2009 | van Winkelhoff et al. | |
| 7,646,626 B2* | 1/2010 | Parkinson | G11C 7/065 365/148 |
| 7,684,244 B2 | 3/2010 | Alami et al. | |
| 8,040,746 B2 | 10/2011 | Jain et al. | |
| 8,183,565 B2* | 5/2012 | Parkinson | G11C 29/24 257/435 |
| 8,194,433 B2 | 6/2012 | Parkinson | |
| 8,194,441 B2* | 6/2012 | Thiruvengadam | G11C 13/004 365/158 |
| 8,345,472 B2* | 1/2013 | Lee | G11C 5/147 365/151 |
| 8,378,456 B1* | 2/2013 | Shepard | H01L 27/1026 257/563 |
| 8,593,881 B2 | 11/2013 | Horesh et al. | |
| 8,767,440 B2 | 7/2014 | Parkinson et al. | |
| 8,934,293 B1* | 1/2015 | Shepard | G11C 8/14 365/163 |
| 9,312,005 B2* | 4/2016 | Castro | G11C 13/0004 |
| 9,349,447 B1* | 5/2016 | Trent | G11C 13/0021 |
| 9,887,004 B2* | 2/2018 | O'Toole | G11C 13/0007 |
| 2002/0018355 A1* | 2/2002 | Johnson | G11C 11/5692 365/103 |
| 2004/0114413 A1* | 6/2004 | Parkinson | G11C 13/0004 365/100 |
| 2006/0002173 A1* | 1/2006 | Parkinson | G11C 13/0004 365/148 |
| 2006/0056251 A1* | 3/2006 | Parkinson | G11C 13/0004 365/202 |
| 2006/0120136 A1* | 6/2006 | Dennison | G11C 5/063 365/148 |
| 2006/0221678 A1* | 10/2006 | Bedeschi | G11C 11/5678 365/163 |
| 2006/0221734 A1* | 10/2006 | Bedeschi | G11C 7/062 365/201 |
| 2006/0227592 A1* | 10/2006 | Parkinson | G11C 11/5678 365/148 |
| 2007/0253242 A1* | 11/2007 | Parkinson | G11C 7/065 365/163 |
| 2008/0035905 A1* | 2/2008 | Parkinson | H01L 27/2409 257/2 |
| 2008/0094871 A1* | 4/2008 | Parkinson | G11C 7/1006 365/100 |
| 2009/0027954 A1* | 1/2009 | Kang | G11C 7/12 365/163 |
| 2009/0116280 A1* | 5/2009 | Parkinson | G11C 13/0004 365/163 |
| 2009/0207645 A1* | 8/2009 | Parkinson | G11C 8/16 365/145 |
| 2009/0244962 A1* | 10/2009 | Gordon | G11C 8/10 365/163 |
| 2009/0302303 A1* | 12/2009 | Lowrey | G11C 5/02 257/5 |
| 2009/0303781 A1* | 12/2009 | Lowrey | G11C 5/02 365/163 |
| 2009/0303782 A1* | 12/2009 | Lowrey | H01L 27/2481 365/163 |
| 2009/0303783 A1* | 12/2009 | Lowrey | G11C 5/02 365/163 |
| 2009/0303784 A1* | 12/2009 | Lowrey | G11C 5/02 365/163 |
| 2009/0307410 A1* | 12/2009 | Lowrey | G11C 5/02 711/101 |
| 2009/0310402 A1* | 12/2009 | Parkinson | G11C 13/0004 365/163 |
| 2010/0012918 A1* | 1/2010 | Parkinson | H01L 27/2409 257/5 |
| 2010/0128516 A1* | 5/2010 | Cho | G11C 7/12 365/163 |
| 2010/0232205 A1* | 9/2010 | Parkinson | G11C 11/56 365/148 |
| 2011/0211391 A1* | 9/2011 | Parkinson | G11C 11/56 365/163 |
| 2011/0254589 A1* | 10/2011 | Gammel | G11C 13/0004 326/51 |
| 2012/0069622 A1* | 3/2012 | Parkinson | G11C 11/22 365/145 |
| 2013/0070511 A1* | 3/2013 | Wells | G11C 8/06 365/148 |
| 2014/0036583 A1* | 2/2014 | Pellizzer | G11C 11/56 365/163 |
| 2014/0104918 A1* | 4/2014 | Castro | G11C 5/06 365/63 |
| 2014/0209892 A1 | 7/2014 | Kuo et al. | |
| 2014/0347912 A1* | 11/2014 | Siau | G11C 7/062 365/148 |
| 2014/0372713 A1* | 12/2014 | Castro | G06F 13/4022 711/154 |
| 2015/0325289 A1* | 11/2015 | Castro | G11C 13/0004 365/148 |
| 2016/0012889 A1* | 1/2016 | Shepard | G11C 13/0069 365/163 |
| 2017/0125483 A1* | 5/2017 | Tanaka | H01L 27/2418 |
| 2017/0372781 A1* | 12/2017 | O'Toole | G11C 13/0069 |

OTHER PUBLICATIONS

Takada, et al.; A 4-Mbit DRAM with Half-Internal Bit-Line Precharge; Solid-State Circuits, IEEE Journal of, vol. 21, No. 5; pp. 612-617; Oct. 1986.
Lee, et al.; A 90nm CMOS 1.8-V 2-Gb NAND Flash Memory for Mass Storage Applications; Solid-State Circuits, IEEE Journal of; vol. 38, No. 11; pp. 1934-1942; Nov. 2003.

\* cited by examiner

OVONIC THRESHOLD SWITCH (OTS) DRIVER/SELECTOR USES UNSELECT BIAS TO PRE-CHARGE MEMORY CHIP CIRCUIT AND REDUCES UNACCEPTABLE FALSE SELECTS

BACKGROUND OF THE DISCLOSURE

Field of the Disclosure

Embodiments of the present disclosure generally relate to data storage and computer memory systems, and more particularly to non-volatile memory and pre-charging a memory chip circuit.

Description of the Related Art

As electronic memories approach limits beyond which they will no longer be able to produce the density, cost, or performance improvements necessary, a host of memory technologies are being investigated as potential replacements for conventional silicon complementary metal oxide semiconductor (CMOS) integrated circuit memories.

Among the memory technologies being investigated are a number of bi-directional memory technologies: memories that exploit a directional characteristic of the material used to program or read a memory device. Conventional memory devices typically associate one of two memory states with the presence or absence of charge, or with a high or low voltage. In such conventional memories, memory states are associated with uni-directional characteristics; charge is either present or not (e.g., DRAM, FLASH) or a node is held at a high or low voltage (e.g., SRAM). There is no sense of "direction" to such storage mechanisms. In contrast, bi-directional memories employ some directional aspect of their memory material to store binary information. For example, one memory state may be written by forcing a current through a bi-directional memory device in one direction or applying a voltage of one polarity, and another memory state may be written by forcing a current through the same device in the opposite direction or applying a voltage of the opposite polarity. The programmed memory states may then be sensed by, for example, applying to the memory device either a voltage to measure current related to memory state, or forcing a current through and measuring a voltage related to memory state.

Bi-directional memory types include resistive random access memories and magneto-resistive random access memories (both referred to as RRAM), programmable metallization cells, Pnictide phase change memories, polymer memories, ferro-electric random access memories (Fe-RAM), ionic memory devices and metal nano-particle memory cells.

A RRAM cell may be programmed, respectively, to high resistance and low resistance values by applying electric pulses of opposite polarities to a cell. The cell's high and low resistance values are employed to represent two different memory states.

$4 F^2$ memory cells are typically built between the intersection of orthogonal first metal and second metal wires running through the memory tile plane in the X-Y directions to select the memory cell. Generally, the width of a cell is 2 F in each direction. Each wire can terminate at the edge and be driven from the far edge, thus increasing the available space for the driver to 4 F. However, the available space remains tight, thus making it difficult to fit a drive transistor therein. As such, little room exists for an interconnect or extra transistors connected to each word line (or bit line in the other direction). Additionally, the gate of the transistor is either on or off, as driven by a decoder. As the select transistor is 1 of N, where N may be 2000 wires in a typical NVM memory (on pitch), when the wire is not selected it is floating and may drift away from the unselect level.

To avoid current leakage in NVM, the word lines and bit lines are provided with half of the voltage of the system (rather than ground or high-impedance). Further, word lines and bit lines can be pre-charged before any operation by a voltage through a high resistance.

In arrays, such as those larger than 1K×1K memory cells, with drivers disposed on each of the four sides, it often becomes difficult to add a transistor or resistor connecting each line to respective unselect bias, such as to V/2. Absent this "keep alive" bias, it is difficult to keep each word line biased at the unselect level, such as V/2. Further, with a transistor connected to the line, the line may drift to the voltage of leakage through the transistor connected thereto. With the deselect level on the drain at zero volts, the word line will inevitably leak away to its voltage, which causes unacceptable false selects. The gate of the select transistor can be controlled by a CMOS NAND decoder, such that the gate is selected high 1/N along the side of the memory tile. Additional space does not exist to add another drive transistor or high value resistor. Furthermore, cycling back to the lines periodically to refresh wastes power and machine cycles.

Therefore, what is needed in the art is an improved memory device. More specifically, what is needed in the art is an ovonic threshold switch (OTS) keep alive for non-volatile memory array select lines, where the OTS is used to pre-charge the memory chip circuit.

SUMMARY OF THE DISCLOSURE

The present disclosure generally relates to non-volatile memory arrays and memory devices in which a leakage current through an ovonic threshold switch (OTS) is utilized to pre-charge a circuit of a memory chip. By running an additional wire on each side of a tile which is orthogonal to, above, or below the X and Y select wires, a high value resistance material, such as an OTS, may be deposited at the intersection. The OTS allows the word line or bit line to be selected without pulling excessive leakage to the select wire from the bias voltage, such as V/2. A thickness of the OTS is adjusted such that the $V_t$ of the OTS is greater than V/2, with margin, and the OTS does not turn on when the OTS is selected. A resistance is created between the V/2 wire and the word line select wire or the bit line select wire. This technique can be applied to bias other signals to other voltages.

In one embodiment, a memory device is disclosed. The memory device includes a word line, a bit line disposed perpendicular to the word line, and a memory element disposed between the word line and the bit line. The memory device also includes a select element coupled to the memory element and a connecting element. The select element is disposed adjacent the word line and the connecting element is disposed between the word line and a voltage source.

In another embodiment, a memory device is disclosed. The memory device includes a word line, a bit line disposed perpendicular to the word line, and a memory element disposed between the word line and the bit line. The memory device also includes a select element coupled to the memory element and a connecting element. The select element is disposed adjacent the bit line and the connecting element is disposed between the bit line and a voltage source.

In another embodiment, a memory array is disclosed. The memory array includes a word line, a bit line disposed perpendicular to the word line, at least one memory device, and at least one connecting element disposed between one of the word line or the bit line and a fixed voltage. The at least one memory device includes a memory element disposed between the word line and the bit line, and a select element coupled to the memory element. The select element is disposed adjacent the word line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to non-volatile memory arrays and memory devices in which a leakage current through an OTS is utilized to pre-charge a circuit of a memory chip. By running an additional wire on each side of a tile which is orthogonal to, above or below, the X and Y select wires, a high value resistance material, such as an OTS, may be deposited at the intersection therein. The OTS allows the word line or bit line to be selected without pulling excessive leakage to the select wire from the bias voltage, such as V/2. A thickness of the OTS is adjusted such that the $V_t$ of the OTS is greater than V/2, with margin, and the OTS does not turn on when the OTS is selected. A resistance is created between the V/2 wire and the word line select wire or the bit line select wire. This technique can be applied to bias other signals to other voltages.

Figure 1A:
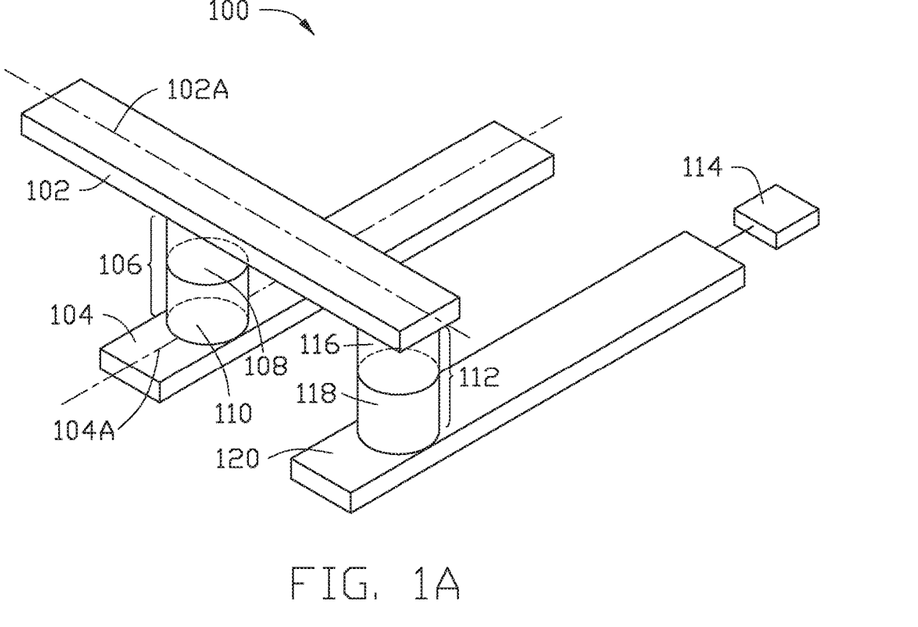
FIG. 1A is a schematic perspective view of a memory device, according to one embodiment described herein.
Figure 1B:
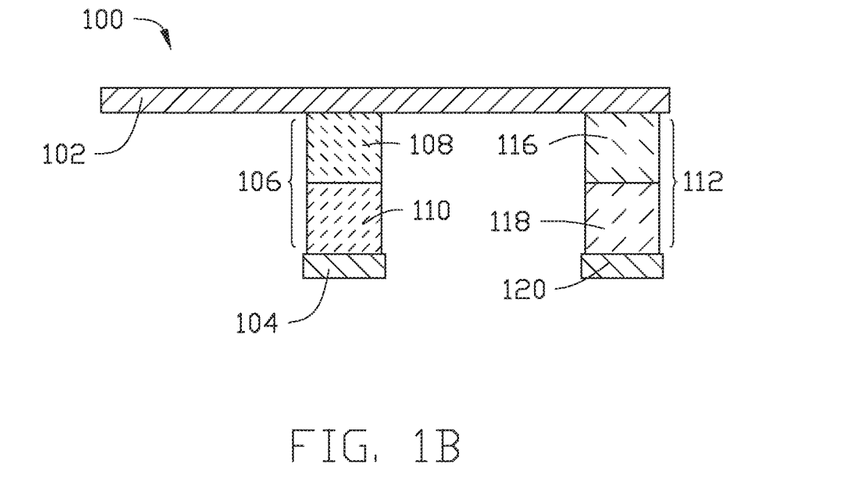
FIG. 1B is a schematic cross-sectional view of the memory device of FIG. 1A, according to one embodiment described herein.

FIGS. 1A and 1B are schematic illustrations of a memory device 100. The memory device 100 has word line 102 having a first longitudinal axis 102A and a bit line 104 having a second longitudinal axis 104A perpendicular to the word line 102.

The memory device 100 further includes a memory cell 106 disposed between the word line 102 and the bit line 104. In some embodiments, the memory cell 106 is coupled to the word line 102 and/or the bit line 104. The memory cell 106 includes a memory element 108 and a select element 110. The memory element 108 is disposed between the word line 102 and the bit line 104. In some embodiments, the memory element 108 is coupled to the word line 102 or the bit line 104. Furthermore, in certain embodiments, the memory element 108 is a resistive random access memory (RRAM) device. In other embodiments, the memory element 108 may be a phase change memory (PCM) device. The select element 110 is coupled to the memory element 108. Furthermore, the select element 110 is disposed adjacent the bit line 104. In certain embodiments, the select element 110 may contact the bit line 104. The select element 110 is selected from the group consisting of an ovonic threshold switch (OTS), a doped chalcogenide alloy, a thin film silicon, a metal-metal oxide switch, or a Field Assisted Superlinear Threshold selector (FAST). Furthermore, in some embodiments, the memory element 108 is in series with the select element 110. It is contemplated, however, that in some embodiments the select element 110 may be disposed adjacent the word line 102 and/or contact the word line 102.

The memory device 100 also includes a connecting element 112. The connecting element 112 is disposed between the word line 102 and a voltage source 114. In some embodiments, the connecting element 112 comprises an undoped or lightly doped polysilicon material. In some embodiments, the connecting element 112 comprises a second memory element 116 and a second select element 118. The second select element 118 of the connecting element 112 may include one of an ovonic threshold switch (OTS), a doped chalcogenide alloy, a thin film silicon, a metal-metal oxide switch, or a FAST. The second memory element 116 of the connecting element 112 comprises a RRAM material and/or device. In other embodiments, the second memory element 116 of the connecting element 112 may comprise a PCM material and/or device. In some embodiments, the connecting element 112 may include only the select element 118 with a thickness equal to approximately the height of memory cell 106. In some embodiments, memory element 116 may be replaced with a select element 118.

As shown in FIGS. 1A and 1B, the connecting element 112 is coupled to the word line 102. In some embodiments, the connecting element 112 may also be coupled to a wire 120. Wire 120 may be substantially similar to the word line 102 and/or the bit line 104 of FIGS. 1A and 1B. However, rather than being a memory wire like word line 102 or bit line 104, wire 120 may be tied to a voltage, such as V/2, where V is the higher write voltage applied across the memory array word line(s) 102 and/or bit line(s) 104. Wire 120 may be similar to a column line under a word line, or a word line over a column line. Array lines may be extended to be over or under the wire 120.

The select element 110 of the memory cell 106 and the second select element 118 of the connecting element 112 may be formed at the same level and/or at the same time using a single masking step. It is contemplated, however, that in some embodiments, the select element 110 and the second select element 118 may be formed at different levels, at different times, and/or utilizing different or distinct mask steps. As such, the memory element 108 and the select element 110 of the memory cell 106 may flip or swap locations between the respective word line 102 and bit line 104. Also, the second memory element 116 and the second select element 118 of the connecting element 112 may flip or swap locations between the respective word line 102 or bit line 104 and the corresponding wire 120. Additionally, in some embodiments, the second memory element 116 and the second select element 118 of the connect element 112 may be made of the same material, and/or one of the second memory element 116 or the second select element 118 may be extended to displace the other entirely.

Figure 2A:
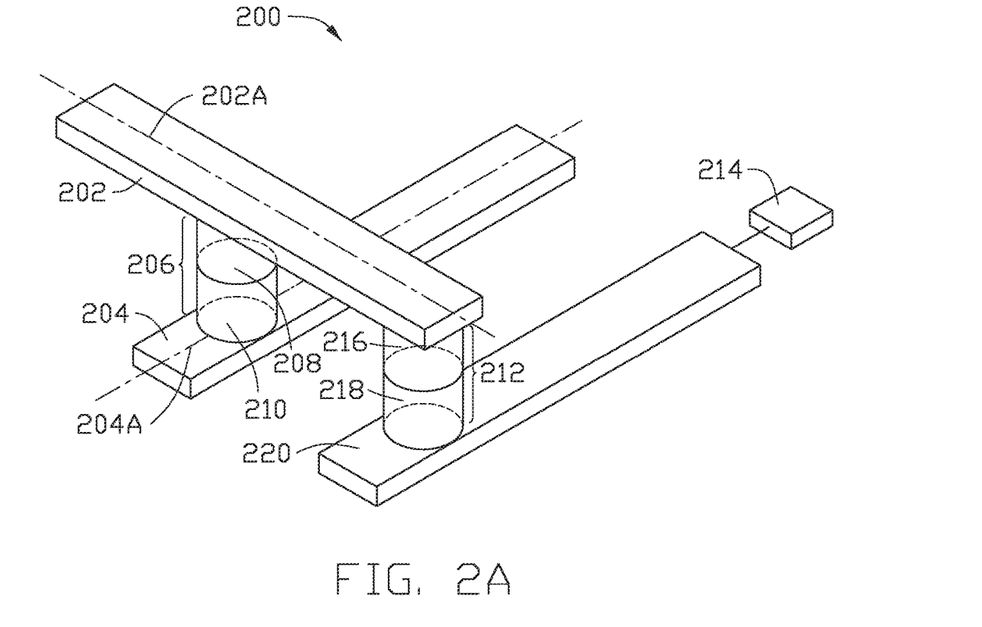
FIG. 2A is a schematic perspective view of a memory device, according to one embodiment described herein.
Figure 2B:
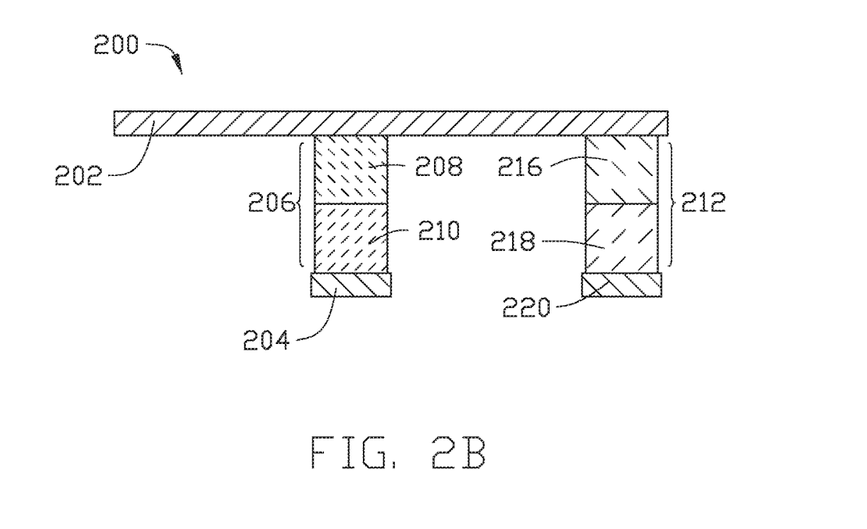
FIG. 2B is a schematic cross-sectional view of the memory device of FIG. 2A, according to one embodiment described herein.

FIGS. 2A and 2B are schematic illustrations of a memory device 200. The memory device 200 has bit line 202 having a first longitudinal axis 202A and a word line 204 having a second longitudinal axis 204A perpendicular to the bit line 202.

The memory device 200 further includes a memory cell 206 disposed between the bit line 202 and the word line 204. In some embodiments, the memory cell 206 is coupled to the bit line 202 and/or the word line 204. The memory cell 206 includes a memory element 208 and a select element 210. The memory element 208 is disposed between the bit line 202 and the word line 204. In some embodiments, the memory element 208 is coupled to the bit line 202 or the word line 204. Furthermore, in certain embodiments, the memory element 208 is a resistive random access memory (RRAM) device. In other embodiments, the memory element 208 may be a phase change memory (PCM) device, a magneto resistive (MRAM) device or Memristor device, without limitation. The select element 210 is coupled to the memory element 208. Furthermore, the select element 210 is disposed adjacent the word line 204. In certain embodiments, the select element 210 may contact the word line 204. The select element 210 is selected from the group consisting of an ovonic threshold switch (OTS), a doped chalcogenide alloy, a thin film silicon, a metal-metal oxide switch, or a FAST. Furthermore, in some embodiments, the memory element 208 is in series with the select element 210. It is contemplated, however, that in some embodiments the select element 210 may be disposed adjacent the bit line 202 and/or contact the bit line 202.

The memory device 200 also includes a connecting element 212. The connecting element 212 is disposed between the bit line 202 and a voltage source 214. In some embodiments, the connecting element 212 comprises an undoped polysilicon material. In some embodiments, the connecting element 212 comprises a second memory element 216 and a second select element 218. The second select element 218 of the connecting element 212 may include one of an ovonic threshold switch (OTS), a doped chalcogenide alloy, a thin film silicon, a metal-metal oxide switch, or a FAST. The second memory element 216 of the connecting element 212 comprises a RRAM material and/or device. In other embodiments, the second memory element 216 of the connecting element 212 may comprise a PCM material and/or device. In some embodiments, the select element 218 may be extended and/or displace the memory element 216, or, in other embodiments, the memory element 216 may be replaced by another select element 218 via the use of mask, deposit techniques, and/or etch techniques familiar to those skilled in the art.

As shown in FIGS. 2A and 2B, the connecting element 212 is coupled to the bit line 202. In some embodiments, the connecting element 212 may also be coupled to a wire 220. Wire 220 may be built substantially similar to the bit line 202 and/or the word line 204 of FIGS. 2A and 2B. However, rather than being a memory wire like bit line 202 or word line 204, wire 220 may be tied to a voltage, such as V/2. Wire 220 may be similar to a column line under a word line, or a word line over a column line. Array lines may be extended to be over or under the wire 220. V may be the max voltage applied across the array word lines and bit lines on a given chip for that cycle and may vary between write and read cycles, being greater for write cycles.

The select element 210 of the memory cell 206 and the second select element 218 of the connecting element 212 may be formed at the same level and/or at the same time using a single masking step. It is contemplated, however, that in some embodiments, the select element 210 and the second select element 218 may be formed at different levels, at different times, and/or utilizing different or distinct mask steps. As such, the memory element 208 and the select element 210 of the memory cell 206 may flip or swap locations between the respective bit line 202 and word line 204. Also, the second memory element 216 and the second select element 218 of the connecting element 212 may flip or swap locations between the respective bit line 202 or word line 204 and the corresponding wire 220. In some embodiments, the select element 218 may displace the memory element 216.

Figure 3A:
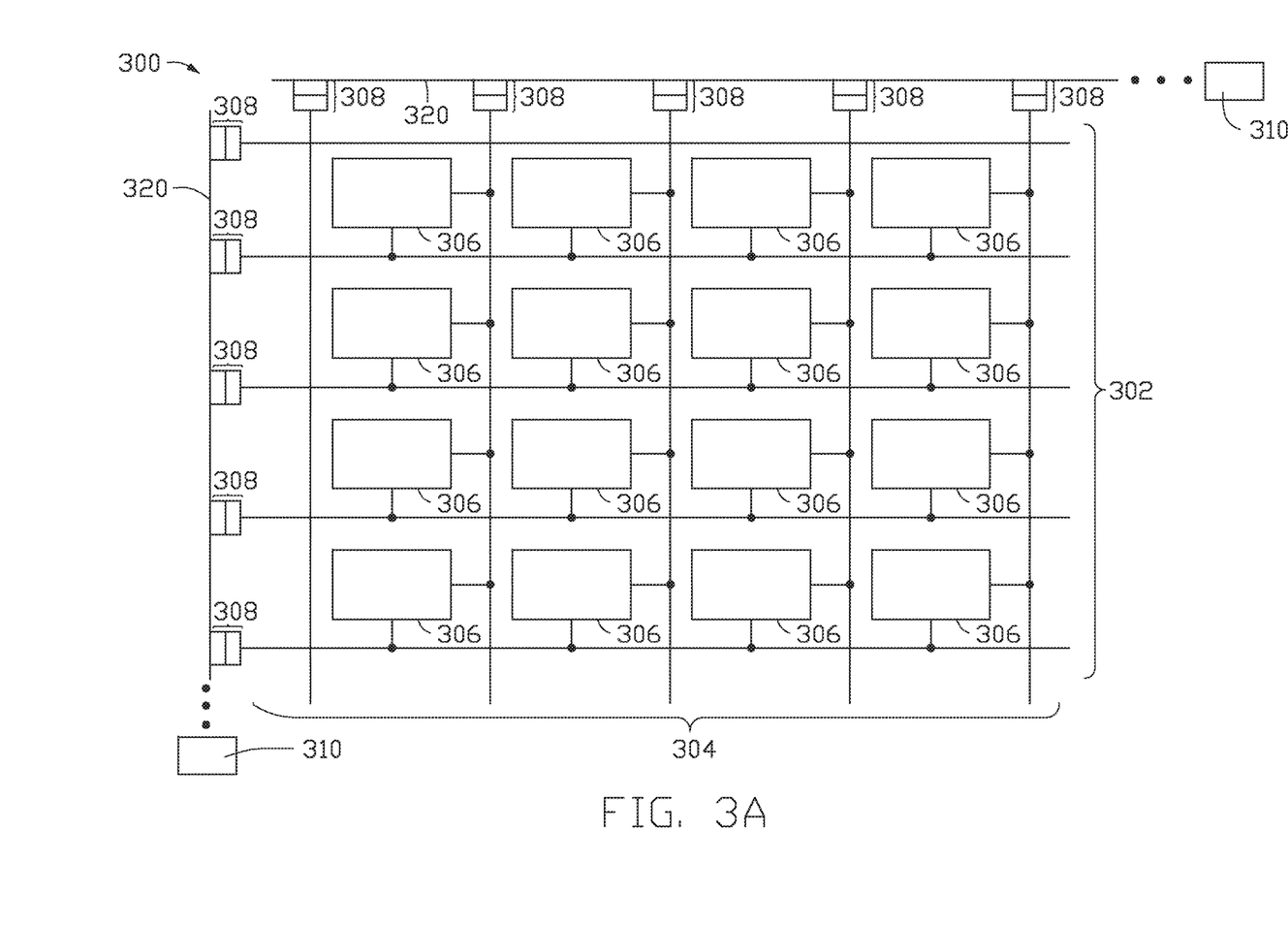
FIG. 3A is a schematic illustration of a memory array, according to one embodiment described herein.

FIG. 3A illustrates a memory array 300, according to one embodiment. The memory array 300 is comprised of a plurality of bottom interconnect lines 302, a plurality of top interconnect lines 304 disposed perpendicular to the plurality of bottom interconnect lines 302, and a plurality of memory cells 306 disposed in between the plurality of bottom interconnect lines 302 and the plurality of top interconnect lines 304. According to one example, in FIGS. 1A and 1B a memory device 100 is shown, and includes a first interconnect line, such as word line 102, a second interconnect line, such as bit line 104, and a memory cell 106 disposed between the word line 102 and the bit line 104. Furthermore, according to another example, in FIGS. 2A and 2B a memory device 200 is shown and includes a first interconnect line, such as bit line 202, a second interconnect line, such as word line 204, and a memory cell 206 disposed between the bit line 202 and the word line 204. Although not shown, it is to be understood that the first plurality of bottom interconnect lines 302 substantially similar to the either of the word lines and/or the bit lines of FIG. 1A, 1B, 2A, or 2B. As such, the first interconnect line 302 may be a word line or a bit line, while the second interconnect line 304 may be a bit line or a word line, respectively, depending on the selection of the first interconnect line 302. The first interconnect line 302 and the second interconnect line 304 may not be the same type of line. To illustrates, the first interconnect line 302 may be a word line and the second interconnect line 302 may be a bit line, or the first interconnect line 302 may be a bit line and the second interconnect line 302 may be a word line.

Each memory device 306 of FIG. 3A may include a memory element and a select element. The memory element is disposed between the first interconnect line 302 and the second interconnect line 304. The select element is coupled to the memory element. In some embodiments, the select element is disposed adjacent either the first interconnect line 302 or the second interconnect line 304.

Memory array 300 further includes at least one connecting element 308. Each connecting element 308 is disposed between one of the first interconnect line 302 or the second interconnect line 304 and a fixed voltage 310. In some embodiments, the fixed voltage 310 may be V/2.

In some embodiments, the connecting element 308 comprises an undoped polysilicon material. In some embodiments, the connecting element 308 comprises a second memory element and a second select element. The second switch element of the connecting element 308 may include one of an ovonic threshold switch (OTS), a doped chalcogenide alloy, a thin film silicon, a metal-metal oxide switch, or a FAST. The second memory element of the connecting element 308 may comprise a RRAM material and/or device. In other embodiments, the second memory element of the connecting element 308 may comprise a PCM material and/or device, MRAM, and/or Memristor, without limitation.

As shown in FIG. 3A, the connecting element 308 is coupled to the first interconnect line 302 and/or the second interconnect line 304. In some embodiments, the connecting element 308 may also be coupled to a wire 320. Wire 320 may be built substantially similar to the first interconnect line 302 and/or the second interconnect line 304. However, rather than being a memory wire like the first interconnect line 302 and/or the second interconnect line 304, wire 320 may be tied to a voltage, such as V/2. Wire 320 may be similar to a column line under a word line, or a word line over a column line. Array lines may be extended to be over or under the wire 320.

Figure 3B:
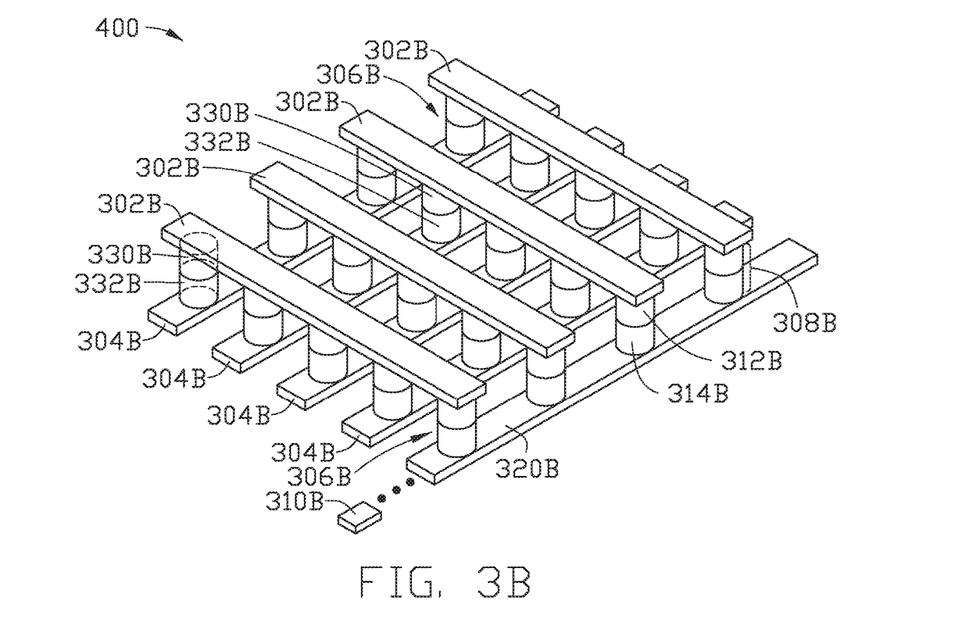
FIG. 3B is a schematic perspective view of the memory array of FIG. 3A, according to one embodiment described herein.

FIG. 3B schematically illustrates a first embodiment of a memory array 400. Memory array 400 is substantially similar to memory array 300 of FIG. 3A. As shown in FIG. 3B, the first interconnect line 302B is a bit line, and the second interconnect line 304B is a word line. At least one memory cell 306B is disposed between each bit line and word line. Each memory device 306B includes a memory element 330B and a select element 332B. The memory element 330B is in series with the select element 332B. The memory element 330B is disposed between the bit line and the word line. The select element 332B is coupled to the memory element 330B. Further, the select element 332B is disposed adjacent the word line. The select element 332B is an ovonic threshold switch (OTS), a doped chalcogenide alloy, a thin film silicon, a metal-metal oxide switch, or a FAST.

The memory array 400 of FIG. 3B also includes the least one connecting element 308B. Each connecting element 308B is disposed between each bit line (first interconnecting line 302B) and a fixed voltage 310B. In some embodiments, the fixed voltage 310B may be V/2.

In some embodiments, the connecting element 308B comprises an undoped polysilicon material. In some embodiments, the connecting element 308B comprises a second memory element 312B and a second select element 314B. The second select element 314B of the connecting element 308B may include one of an OTS, a doped chalcogenide alloy, a thin film silicon, a metal-metal oxide switch, or a FAST. The second memory element 312B of the connecting element 308B may comprise a RRAM material and/or device. In other embodiments, the second memory element 312B of the connecting element 308B may comprise a PCM material and/or device.

As shown in FIG. 3B, the connecting element 308B is coupled to each bit line (first interconnecting line 302B) of the memory array 400B. As further shown, the connecting element 308B is also coupled to wire 320B. Wire 320B is substantially similar to the bit line (first interconnecting line 302B). However, rather than being a memory wire like the bit line (first interconnecting line 302B), wire 320B is tied to a voltage 310B, such as V/2.

Figure 3C:
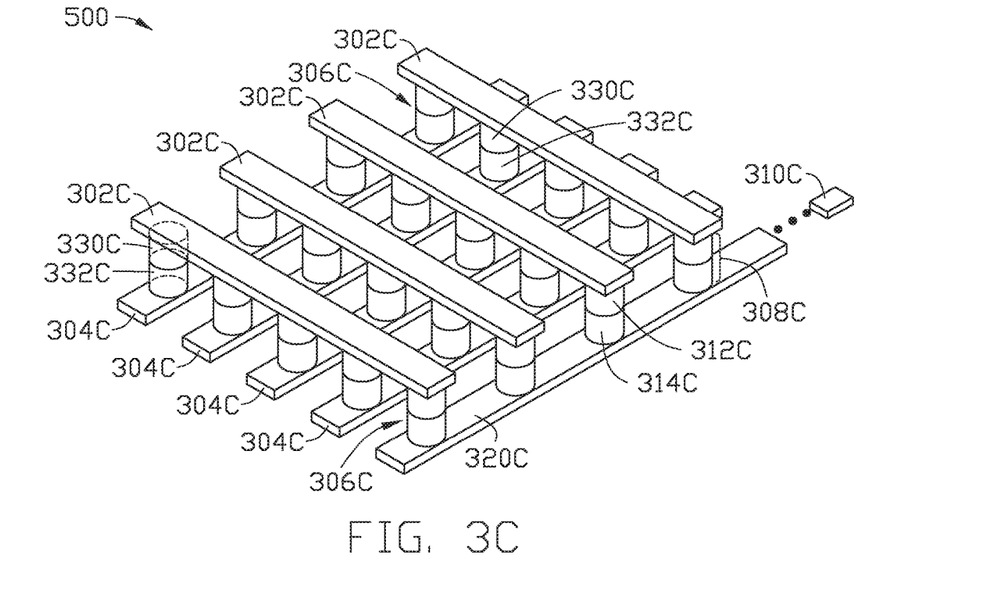
FIG. 3C is a schematic perspective view of the memory array of FIG. 3A, according to one embodiment described herein.

FIG. 3C schematically illustrates a first embodiment of a memory array 500. Memory array 500 is substantially similar to memory array 300 of FIG. 3A. As shown in FIG. 3C, the first interconnect line 302C is a word line, and the second interconnect line 304C is a bit line. At least one memory device 306C is disposed between each word line and bit line. Each memory device 306C includes a memory element 330C and a select element 332C. The memory element 330C is in series with the select element 332C. The memory element 330C is disposed between the word line and the bit line. The select element 332C is coupled to the memory element 330C. Further, the select element 332C is disposed adjacent the bit line. The select element 332C is an OTS, a doped chalcogenide alloy, a thin film silicon, a metal-metal oxide switch, or a FAST.

The memory array 500 of FIG. 3C also includes the least one connecting element 308C. Each connecting element 308C is disposed between each word line (first interconnecting line 302C) and a fixed voltage 310C. In some embodiments, the fixed voltage 310C may be V/2.

In some embodiments, the connecting element 308C comprises an undoped polysilicon material. In some embodiments, the connecting element 308C comprises a second memory element 312C and a second select element 314C. The second select element 314C of the connecting element 308C may include one of an OTS, a doped chalcogenide alloy, a thin film silicon, a metal-metal oxide switch, or a FAST. The second memory element 312C of the connecting element 308C may comprise a RRAM material and/or device. In other embodiments, the second memory element 312C of the connecting element 308C may comprise a PCM material and/or device.

As shown in FIG. 3C, the connecting element 308C is coupled to each word line (first interconnecting line 302C) of the memory array 500. As further shown, the connecting element 308C is also coupled to wire 320C. Wire 320C is substantially similar to the word line (first interconnecting line 302C). However, rather than being a memory wire like the word line (first interconnecting line 302C), wire 320C is tied to a voltage 310C, such as V/2.

Figure 4:
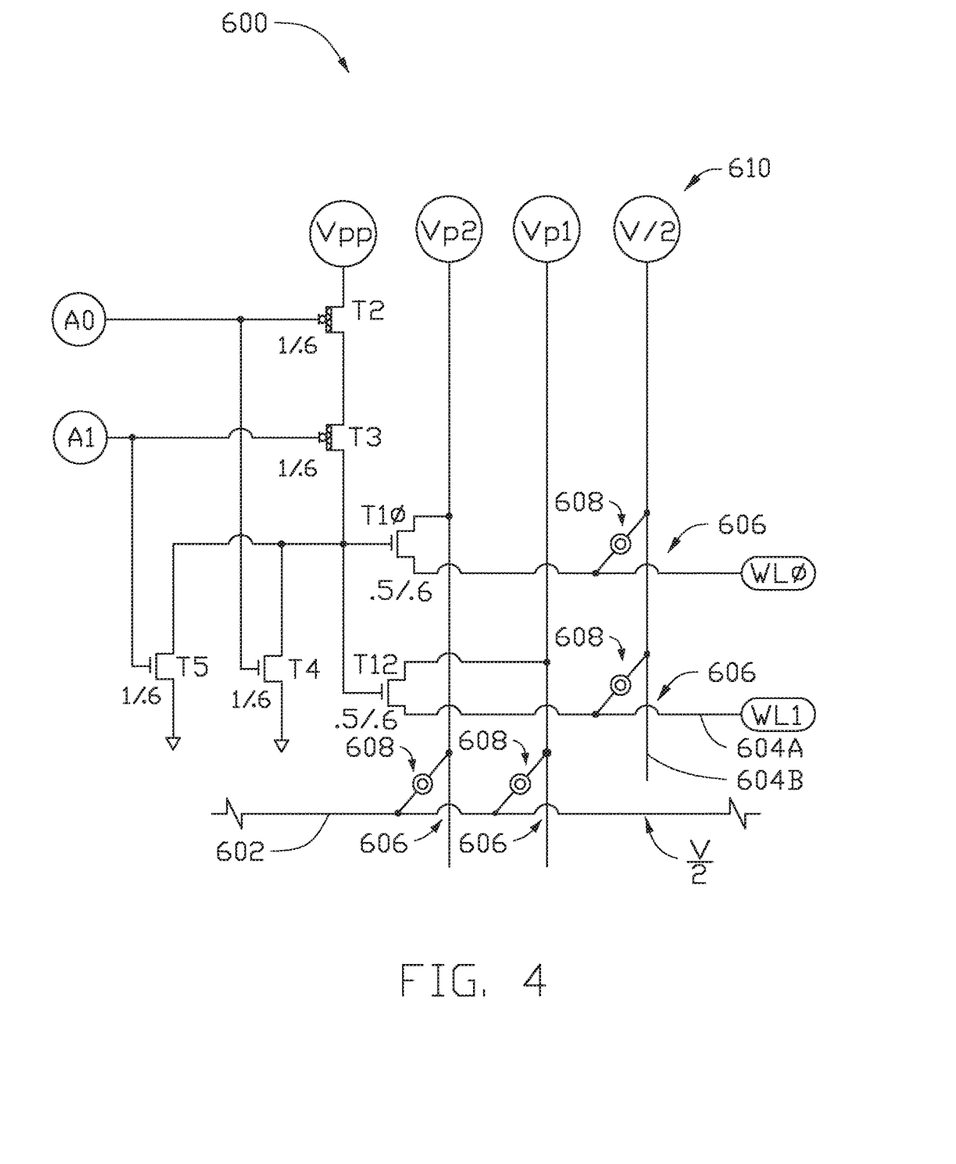
FIG. 4 is a schematic circuit diagram of a row decoder for an ovonic threshold switch keep alive system, according to one embodiment described herein.

FIG. 4 is a schematic circuit diagram 600 of a row decoder for an ovonic threshold switch keep alive system. As shown, wire 602 is operatively connected to under and/or above to a word line or a bit line 604A, 604B. In certain embodiments, the word line 604A may be an X select wire and the bit line 604B may be a Y select wire. It is contemplated, however, that in certain embodiments, the bit line 604B may be the X select wire, and the word line may be the Y select wire. The wire 602 may be substantially similar to the wire 120 of FIG. 1, the wire 220 of FIG. 2A or FIG. 2B, or the wire 320 of FIG. 3A or FIG. 3B. A high value resistance material 608 is disposed at the intersection 606 of the word line 604A and the bit line 604B. In some embodiments, the high value resistance material 608 includes an undoped semiconductor material or an ovonic threshold switch (OTS), either of which have a high resistance which allows the word line or the bit line to be selected without pulling excessive leakage to the select wire from the bias voltage, such as V/2.

The fabrication of the row decoder device for an ovonic threshold switch keep alive system may include providing a mask to define a region between the metal wires (for example, the word line 604A, the bit line 604B, and/or the wire 602), in which is deposited the high value resistance material 608 (for example, the OTS). In some embodiments, the OTS may be deposited with electrodes to encapsulate the OTS. The OTS may have a thickness adjusted such that a $V_t$ of the OTS is greater than V/2 with a margin so that the OTS does not turn on when the OTS is selected. As such, a resistance is created between the V/2 wire 610 and the any of the word line select wire, or between the V/2 wire 610 and the bit line select wire (in the Y-direction), as similarly done for the word line selected wire.

Benefits of the present disclosure include avoidance of the need to individually refresh the word lines and bit lines upon power up and after an unselect. By providing an additional wire down each side of the tile which are orthogonal to, above or below the X and Y select wires, a material may be deposited at the intersection using a mask to define a region in which a high value resistance material is deposited. A first end of the wire is connected to the unselect bias voltage, such as V/2 where V is the write voltage applied across the array X and Y select wires. As such, the floating wires are maintained at the unselect voltage V/2 and driven there automatically upon power up.

Additional benefits include that in a non-volatile memory array, leakage current through a non-conducting OTS is used to pre-charge a circuit of the memory chip. Specifically, the OTS is utilized to pre-charge the word lines and the bit lines. The pre-charge voltage may be half of the operating voltage. The connecting element "keep-alive" can also be applied to other signals on a chip by placement between the signal and appropriate voltage, which may be a DC or voltage that varies.

In summation, non-volatile memory arrays and memory devices in which a leakage current through an OTS is utilized to pre-charge a circuit of a memory chip is disclosed. By running an additional wire on each side of a tile which is orthogonal to, above, or below the X and Y select wires, a high value resistance material, such as an OTS, may be deposited at the intersection. The OTS allows the word line or bit line to be selected without pulling excessive leakage to the select wire from the bias voltage, such as V/2. A thickness of the OTS is adjusted such that the $V_t$ of the OTS is greater than V/2, with margin, and the OTS does not turn on when the OTS is selected. A resistance is created between the V/2 wire and the word line select wire or the bit line select wire. The resistance can replace a transistor which can connect the wire to the voltage when the wire is not selected or during inactive portions of the memory cycle.

While the foregoing is directed to embodiments of the present disclosure, other and further embodiments of the disclosure may be devised without departing from the basic scope thereof, and the scope thereof is determined by the claims that follow.

What is claimed is:

1. A memory device, comprising:
    a word line;
    a bit line disposed perpendicular to the word line;
    a memory element disposed between the word line and the bit line;
    a select element coupled to the memory element, wherein the select element is disposed adjacent to the bit line wherein the select element is selected from the group consisting of an ovonic threshold switch (OTS), a doped chalcogenide alloy, a thin film silicon, a metal-metal oxide switch, or a Field Assisted Superlinear Threshold selector (FAST);
    a wire that at least partly overlaps the word line, the wire coupled with a voltage source providing a predefined unselect bias voltage; and
    a connecting element comprising an undoped polysilicon material disposed between the word line and the wire wherein the connecting element comprises a second memory element and a second select element, wherein the second select element is constructed from one of a RRAM and a MRAM material.

2. The memory device of claim 1, wherein the connecting element comprises an ovonic threshold switch (OTS), a doped chalcogenide alloy, a thin film silicon, a metal-metal oxide switch, or a Field Assisted Superlinear Threshold selector (FAST).

3. The memory device of claim 1, wherein the second memory element comprises a Resistive Random Access Memory (RRAM) material, and wherein the second select element comprises an ovonic threshold switch (OTS), a doped chalcogenide alloy, a thin film silicon, a metal-metal oxide switch, or a Field Assisted Superlinear Threshold selector (FAST).

4. The memory device of claim 1, wherein the memory element is in series with the select element.

5. The memory device of claim 1, wherein the memory element is a Resistive Random Access Memory (RRAM) device or a Phase Change Memory (PCM) device.

6. The memory device of claim 1,
    wherein the word line is disposed at a first conductive layer and the bit line is disposed at a different second conductive layer, and
    wherein the wire is disposed at the second conductive layer.

7. The memory device of claim 6,
    wherein the word line has a first longitudinal axis and the bit line has a second longitudinal axis that is perpendicular to the first longitudinal axis, and
    wherein the wire is substantially parallel to the second longitudinal axis.

8. The memory device of claim 6, wherein the connecting element comprises an ovonic threshold switch (OTS), wherein a thickness of the OTS between the first conductive layer and the second conductive layer is selected such that a threshold voltage of the OTS is greater than the predefined unselect bias voltage and such that the OTS does not turn on when the OTS is selected.

9. A memory device, comprising:
    a word line;
    a bit line disposed perpendicular to the word line;
    a memory element disposed between the word line and the bit line;

a select element coupled to the memory element, wherein the select element is disposed adjacent to the bit line;
a wire that at least partly overlaps the word line, the wire coupled with a voltage source providing a predefined unselect bias voltage; and
a connecting element disposed between the word line and the wire wherein the connecting element comprises a second memory element and a second select element, wherein the second select element is constructed from one of a RRAM and a MRAM material wherein the connecting element comprises an undoped polysilicon material.

10. A memory device, comprising:
a word line;
a bit line disposed perpendicular to the word line;
a memory element disposed between the word line and the bit line;
a select element comprised of an ovonic threshold switch (OTS), a doped chalcogenide alloy, a thin film silicon, a metal-metal oxide switch, or a Field Assisted Superlinear Threshold selector (FAST), the select element coupled to the memory element, wherein the select element is disposed adjacent to the word line;
a wire that at least partly overlaps the bit line, the wire coupled with a voltage source providing a predefined unselect bias voltage; and
a connecting element wherein the connecting element comprises an undoped polysilicon material, the connecting element disposed between the bit line and the wire wherein the connecting element comprises a second memory element and a second select element wherein the second select element is constructed from one of a RRAM and a MRAM material.

11. The memory device of claim 10, wherein the connecting element comprises an ovonic threshold switch (OTS), a doped chalcogenide alloy, a thin film silicon, a metal-metal oxide switch, or a Field Assisted Superlinear Threshold selector (FAST).

12. The memory device of claim 10, wherein the second memory element comprises a Resistive Random Access Memory (RRAM) material, and wherein the second select element comprises an ovonic threshold switch (OTS), a doped chalcogenide alloy, a thin film silicon, a metal-metal oxide switch, or a Field Assisted Superlinear Threshold selector (FAST).

13. The memory device of claim 10, wherein the memory element is in series with the select element.

14. The memory device of claim 10, wherein the memory element is a Resistive Random Access Memory (RRAM) device or a Phase Change Memory (PCM) device.

15. A memory device, comprising:
a word line;
a bit line disposed perpendicular to the word line;
a memory element disposed between the word line and the bit line;
a select element coupled to the memory element, wherein the select element is disposed adjacent to the word line;
a wire that at least partly overlaps the bit line, the wire coupled with a voltage source providing a predefined unselect bias voltage; and
a connecting element disposed between the bit line and the wire wherein the connecting element comprises a second memory element and a second select element wherein the second select element is constructed from one of a RRAM and a MRAM material wherein the connecting element comprises an undoped polysilicon material.

16. A memory array, comprising:
a plurality of word lines;
a plurality of bit lines that are disposed perpendicular to the plurality of word lines wherein (i) each word line of the plurality of word lines or (ii) each bit line of the plurality of bit lines is connected with a respective connecting element of the plurality of connecting elements in the memory array;
a plurality of memory devices, each memory device of the plurality of memory devices disposed between a respective word line of the plurality of word lines and a respective bit line of the plurality of bit lines, each memory device respectively comprising:
a memory element; and
a select element coupled to the memory element, wherein the select element is disposed adjacent to the respective word line or to the respective bit line;
a wire that at least partly overlaps (i) each of the plurality of word lines or (ii) each of the plurality of bit lines, the wire coupled with a voltage source providing a predefined unselect bias voltage; and
a plurality of connecting elements, each connecting element of the plurality of connecting elements disposed between (i) the wire and a respective word line of the plurality of word lines or (ii) the wire and a respective bit line of the plurality of bit lines wherein each connecting element of the plurality of connecting elements respectively comprises a second memory element and a second select element wherein the second select element is constructed from one of a RRAM and a MRAM material wherein each connecting element of the plurality of connecting elements comprises an undoped polysilicon material.

17. The memory array of claim 16, wherein the select element is an ovonic threshold switch (OTS), a doped chalcogenide alloy, a thin film silicon, a metal-metal oxide switch, or a Field Assisted Superlinear Threshold selector (FAST).

18. The memory array of claim 16, wherein each connecting element of the plurality of connecting elements comprises an ovonic threshold switch (OTS), a doped chalcogenide alloy, a thin film silicon, a metal-metal oxide switch, or a Field Assisted Superlinear Threshold selector (FAST).

19. The memory array of claim 16, wherein the second memory element comprises a Resistive Random Access Memory (RRAM) material, and wherein the second select element comprises an ovonic threshold switch (OTS), a doped chalcogenide alloy, a thin film silicon, a metal-metal oxide switch, or a Field Assisted Superlinear Threshold selector (FAST).

20. The memory array of claim 16, wherein the memory element is in series with the select element.

21. The memory array of claim 16, wherein the memory element is a Resistive Random Access Memory (RRAM) device or a Phase Change Memory (PCM) device.

22. A memory array, comprising:
a plurality of word lines;
a plurality of bit lines that are disposed perpendicular to the plurality of word lines;
a plurality of memory devices, each memory device of the plurality of memory devices disposed between a respective word line of the plurality of word lines and a respective bit line of the plurality of bit lines, each memory device respectively comprising:
a memory element; and a select element coupled to the memory element, wherein the select element is disposed adjacent to the respective word line or to the respective bit line;

a wire that at least partly overlaps (i) each of the plurality of word lines or (ii) each of the plurality of bit lines, the wire coupled with a voltage source providing a predefined unselect bias voltage; and a plurality of connecting elements, each connecting element of the plurality of connecting elements disposed between (i) the wire and a respective word line of the plurality of word lines or (ii) the wire and a respective bit line of the plurality of bit lines wherein each connecting element of the plurality of connecting elements respectively comprises a second memory element and a second select element wherein the second select element is constructed from one of a RRAM and a MRAM material wherein each connecting element of the plurality of connecting elements comprises an undoped polysilicon material.

* * * * *